(12) United States Patent
Kalnitsky et al.

(10) Patent No.: US 6,190,968 B1
(45) Date of Patent: Feb. 20, 2001

(54) METHOD FOR FORMING EPROM AND FLASH MEMORY CELLS WITH SOURCE-SIDE INJECTION

(75) Inventors: Alexander Kalnitsky, San Francisco; Albert Bergemont, Palo Alto; Christoph Pichler, San Francisco, all of CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/185,893

(22) Filed: Nov. 4, 1998

(51) Int. Cl.$^7$ .................................................. H01L 21/8247

(52) U.S. Cl. .......................................................... 438/259

(58) Field of Search .................................... 438/257–267

(56) References Cited

U.S. PATENT DOCUMENTS

| | | |
|---|---|---|
| 4,652,897 | 3/1987 | Okuyama et al. ................. 357/23.5 |
| 4,929,988 * | 5/1990 | Yoshikawa . |
| 5,204,835 | 4/1993 | Eitan ..................................... 365/185 |
| 5,297,082 | 3/1994 | Lee ....................................... 365/185 |
| 5,445,981 | 8/1995 | Lee ........................................... 437/43 |
| 5,488,244 | 1/1996 | Quek et al. ........................... 257/314 |
| 5,502,321 | 3/1996 | Matsushita ........................... 257/316 |
| 5,557,567 | 9/1996 | Bergemont et al. ............ 365/185.16 |
| 5,574,685 | 11/1996 | Hsu ................................. 365/185.18 |
| 5,596,213 | 1/1997 | Lee ....................................... 257/316 |
| 5,780,341 | 7/1998 | Ogura ................................... 438/259 |

OTHER PUBLICATIONS

Houdt, J.V. et al., "HIMOS—A High Efficiency Flash E$^2$PROM Cell for Embedded Memory Applications," IEEE Transactions on Electron Devices, vol. 40, No. 12, Dec. 1993, pp. 2255–2263.

Houdt, J.V. et al., "A 5 V–Compatible Flash EEPROM Cell with Microsecond Programming Time for Embedded Memory Applications," IEEE Transactions on Components, Packaging and Manufacturing Technology—Part A, vol. 17, No. 3, Sep. 1994, pp.380–389.

Houdt, J.V. et al., "Investigation of the Soft–Write Mechansim in Source–Side Injection Flash EEPROM Devices," IEEE Electron Device Letters, vol. 16, No. 5, May 1995, pp. 181–183.

Houdt, J.V. et al., "An Analytical Model for the Optimization of Source–Side Injection Flash EEPROM Devices," IEEE Transactions on Electron Devices, vol. 42, No. 7, Jul. 1995, pp. 1314–1320.

Houdt, J.V. et al., "Investigation and Suppression of the Gate Disturb Effect in Source–Side Injection Flash Eeprom Arrays," IMEC –Kapeldreef 75 –B3001 Leuven—Belgium, 4 pages.

Houdt, J.V. et al., "Subthreshold Source–side Injection ($S^3I$): A Promising Programming Mechanism for Scaled–Down, Low Power Flash Memories" Proc. ESSDERC, 1996, pp. 131–134.

Houdt, J.V. et al., "The High Injection MOS cell: a novel 6V–only Flash EEPROM Concept with 1$\mu$s Programming Time," Microelectronic Engineering 15 (1991) pp. 617–620.

Houdt, J.V. et al., "Analysis of the Enhanced Hot–Electron Injection in Split–Gate Transistors Useful for EEPROM Applications" IEEE Transactions on Electron Devices, vol. 39, No. 5, May 1992, pp. 1150–1156.

(List continued on next page.)

Primary Examiner—Richard Booth
(74) Attorney, Agent, or Firm—Limbach & Limbach L.L.P.

(57) ABSTRACT

A method for forming an electrically-programmable read-only-memory (EPROM) or a flash memory cell is disclosed. The EPROM or flash memory cell provides both source-side and drain-side injection, along with a reduced cell size, by forming the memory cell in a trench. The drain is formed in the top surface of the substrate, the source is formed in the bottom surface of the trench, and the stacked gate is formed over the sidewall of the trench.

12 Claims, 8 Drawing Sheets

OTHER PUBLICATIONS

Houdt, J.V. et al., "An Analytical Model for the Optimization of High Injection MOS Flash E'PROM Devices," Microelectronic Engineering 19 (1992) pp. 257–260.

Houdt, J.V. et al., "A 5V/3.3V–compatible Flash E'PROM cell with a 400ns/70µs Programming Time for Embedded Memory Applications," 1993 Nonvolatile Memory Technology Review, pp. 54–57.

Houdt, J.V. et al., "HIMOS: an Attractive Flash EEPROM Cell for Embedded Memory Applications," Microelectronics Journal, vol. 24, No. 3, (1993) pp. 190–194.

Chi, M. et al., "Multi–Level Flash/EPROM Memories: New Self–convergent Programming Methods for Low–voltage Applications," Fairchild Research Center, Santa Clara, CA 4 pages.

Houdt, J.V. et al., "Optimization of a Submicron HIMOS Flash E'PROM Cell for Implementation in a Virtual Ground Array Configuration," Proc. ESSDERC 1993, Ed. J. Borel et al., Editions Frontieres, (1993) pp. 381–394.

Wellekens, D. et al., "Write/Erase Degradation in Source Side Injection Flash EPPROM's: Characterization Techniques and Wearout Mechanisms" IEEE Transactions on Electron Devices, vol. 42, No. 11, Nov. 1995, pp. 1992–1998.

Wellekens, D. et al., "Write/Erase Degradation and Disturb Effects in Source–side Injection Flash Eeprom Devices" Proceedings of the 5th European Symposium on Reliability of Electron Devices, Failure Physics and Analysis, Glasgow, Scotland, Oct. 4–7, 1994.

* cited by examiner

METHOD FOR FORMING EPROM AND FLASH MEMORY CELLS WITH SOURCE-SIDE INJECTION

RELATED APPLICATION

The present application is related to application Ser. 09/185,892 for EPROM and Flash Memory Cells with Source-Side Injection by Alexander Kalnitsky et al. which is filed on an even date herewith.

BACKGROUND OF THE INVENTION

1. Field of the Invention

The present invention relates to EPROM and flash memory cells and, more particularly, EPROM and flash memory cells with source-side injection.

2. Description of the Related Art

An electrically-programmable read-only-memory (EPROM) cell and a flash memory cell are non-volatile memories that retain data stored in the cell after power to the cell has been removed. EPROM and flash memory cells principally differ from each other in that EPROM cells are erased with ultraviolet (UV) light, while flash cells are electrically erased.

FIG. 1 shows a cross-sectional view that illustrates a prior art EPROM or flash memory cell 100. As shown in FIG. 1, cell 100 includes spaced-apart n+ source and drain regions 112 and 114 which are formed in a p-type substrate 110, and a channel region 116 which is defined in substrate 110 between source and drain regions 112 and 114.

In addition, cell 100 also includes a layer of gate oxide 120 which is formed over channel region 116, and a floating gate 122 which is formed over gate oxide layer 120. Further, cell 100 additionally includes a layer of interpoly dielectric 124 which is formed over floating gate 122, and a control gate 126 which is formed over dielectric layer 124.

Cell 100 is programmed by applying a programming voltage to control gate 126, a drain voltage to drain region 114, and ground to source region 112. The programming voltage applied to control gate 126 induces a positive potential on floating gate 122 which, in turn, attracts electrons to the surface of channel region 116 to form a channel 130.

In addition, the source-to-drain voltage sets up an electric field which causes electrons to flow from source region 112 to drain region 114 via channel 130. As the electrons flow to drain region 114, the electric field, which has a maximum near drain region 114, accelerates these electrons into having ionizing collisions that form channel hot electrons near drain region 114.

A small percentage of the channel hot electrons are then injected onto floating gate 122 via gate oxide layer 120. Cell 100 is programmed when the number of electrons injected onto floating gate 122 is sufficient to prevent channel 130 from being formed when a read voltage is subsequently applied to control gate 124.

Since only a small percentage of the channel hot electrons are injected onto floating gate 122, channel hot electron programming provides a relatively low injection efficiency. One technique for increasing the injection efficiency is to create a source-to-drain electric field which, in addition to having a peak near the drain region, also has a peak near the source region. EPROM and flash memory cells which utilize an electric field which has a peak near the source region are typically referred to as having source side injection.

One way of forming an electric field which has a peak near both the source and drain regions, as described in U.S. Pat. No. 4,652,897 to Okuyama et al., is to use a low-density source region which is adjacent to the source region.

FIG. 2 shows a cross-sectional view that illustrates a prior-art, source-side injection EPROM or flash memory cell 200. FIG. 2 is similar to FIG. 1 and, as a result, utilizes the same reference numerals to designate the structures which are common to both cells.

As shown in FIG. 2, source-side cell 200 differs from cell 100 in that cell 200 also includes a n-type low-density source (LDS) region 210 which is formed between source region 112 and channel region 130. LDS region 210 has a dopant concentration which is less than the dopant concentration of source region 112.

In operation, cell 200 is programmed the same as cell 100 except that the presence of LDS region 210 causes the source-to-drain electric field to have peaks near both the LDS and drain regions 210 and 114. As a result, channel hot electrons are formed and injected onto floating gate 122 near both of these regions 210 and 114, thereby increasing the injection efficiency.

FIG. 3 shows a graph that illustrates the intensity of the electric field along the surface of the channel region between the drain and source regions of cell 200. As shown in FIG. 3, line LO illustrates that cell 200 has a peak in the intensity of the electric field near both the drain and source regions.

One disadvantage of cell 200, however, is that as a result of LDS region 210, cell 200 consumes significantly more silicon real estate than does cell 100. Thus, there is a need for an EPROM or flash memory cell that provides an increased injection efficiency with reduced cell size.

SUMMARY OF THE INVENTION

The present invention provides a method for forming a memory device having electrically-programmable read-only-memory (EPROM) or flash memory cells with both source-side and drain-side injection. The memory cells obtain a reduced cell size by forming the memory cells along the sides of trenches.

The method of the present invention begins by forming a plurality of trenches in a semiconductor material of a first conductivity type. The plurality of trenches define a plurality of top surface strips and have a plurality of bottom surfaces and sidewall surfaces such that each trench has a bottom surface and a pair of sidewall surfaces which connect the bottom surface to the adjoining top surface strips.

Once the trenches have been formed, a layer of gate oxide is formed over the top surface strips, the bottom surfaces, and the sidewall surfaces. Next, a layer of first polysilicon (poly-1) is formed on the gate oxide layer. A layer of interpoly dielectric is then formed on the poly-1 layer, followed by the formation of a second layer of polysilicon (poly-2) on the interpoly dielectric layer.

After the layer of poly-2 has been formed, the poly-2 layer, the layer of interpoly dielectric, and the layer of poly-1 are selectively etched to form a plurality of stacked gates structures where each stacked gate structure has a floating gate and a control gate.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 7A–11A are plan views illustrating a process for forming segment 600 in accordance with the present invention.

FIGS. 7B–11B are cross-sectional views taken along line 7B—7B, 8B—8B, 9B—9B, 10B—10B, and 11B—11B of FIGS. 7A, 8A, 9A, 10A, and 11A, respectively.

FIGS. 7C–11C are cross-sectional views taken along lines 7C—7C, 8C—8C, 9C—9C, 10C—10C, and 11C—11C of FIGS. 7A, 8A, 9A, 10A, and 11A, respectively.

DETAILED DESCRIPTION

Figure 4:
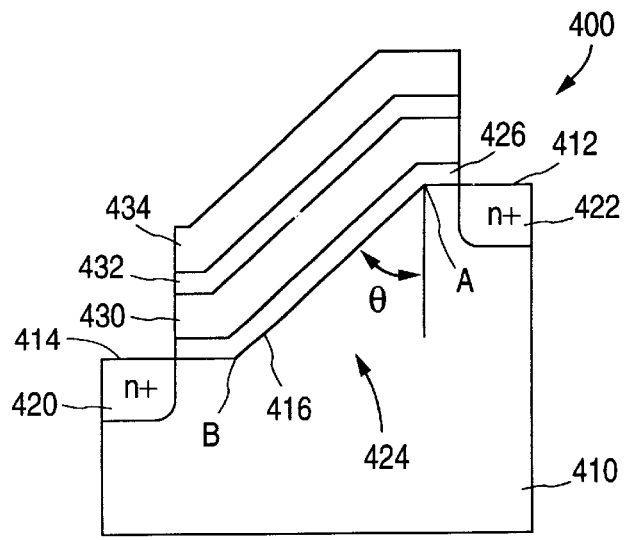
FIG. 4 is a cross-sectional view illustrating an EPROM or flash EPROM cell 400 in accordance with the present invention.

FIG. 4 shows a cross-sectional view that illustrates an EPROM or flash EPROM cell 400 in accordance with the present invention. As described in greater detail below, cell 400 provides both source-side and drain-side injection, along with a reduced cell size, by forming cell 400 along the sidewall of a trench.

As shown in FIG. 4, cell 400 includes a p-type semiconductor material 410, such as a substrate or a well. Material 410, in turn, has a first surface 412, a second surface 414 which is vertically and horizontally spaced-apart from first surface 412, and a sidewall surface 416 which is connected to first surface 412 at point A, and to second surface 414 at point B. A line drawn through points A and B, and a line normal to first surface 412 through point A define an acute angle φ which ranges from greater than zero to less than 90 degrees.

As further shown in FIG. 4, cell 400 includes a n+ source region 420 which is formed in material 410 to contact second surface 414, and a n+ drain region 422 which is formed in material 410 to contact first surface 412. Cell 400 also includes a channel region 424 which is defined in material 410 between source and drain regions 420 and 422, and a layer of gate oxide 426 which is formed on material 410 over channel region 424.

In addition, cell 400 further includes a floating gate 430 which is formed over gate oxide layer 426, a layer of interpoly dielectric 432 which is formed over floating gate 430, and a control gate 434 which is formed over dielectric layer 432.

In operation, cell 400 is programmed the same as cell 100 except that the geometry of the cell causes the source-to-drain electric field to have peaks near both the source and drain regions 420 and 422. As a result, channel hot electrons are formed and injected onto floating gate 430 near both of these regions 420 and 422.

Figure 1:
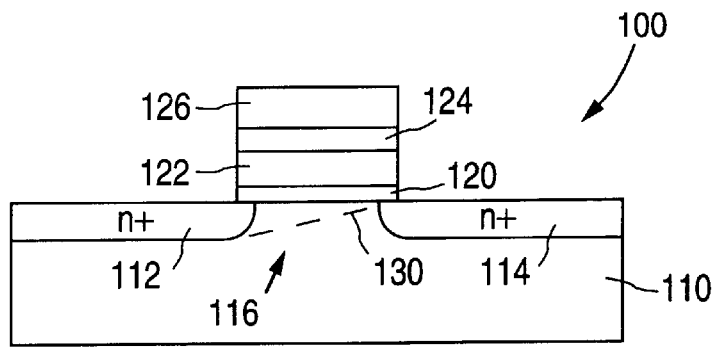
FIG. 1 is a cross-sectional view illustrating a prior art EPROM or flash memory cell 100.
Figure 2:
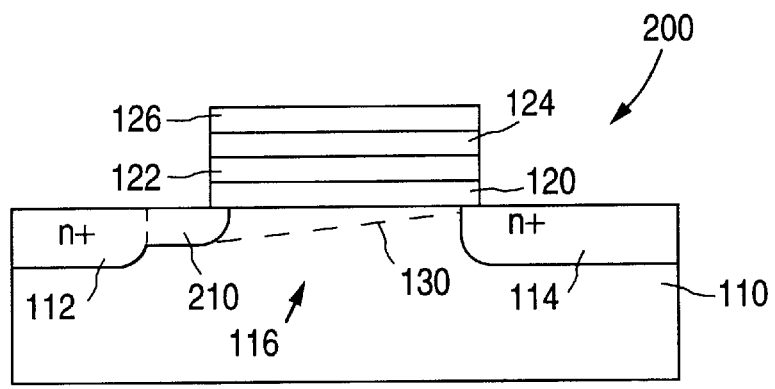
FIG. 2 is a cross-sectional view illustrating a prior-art, drain and source-side injection EPROM or flash memory cell 200.
Figure 3:
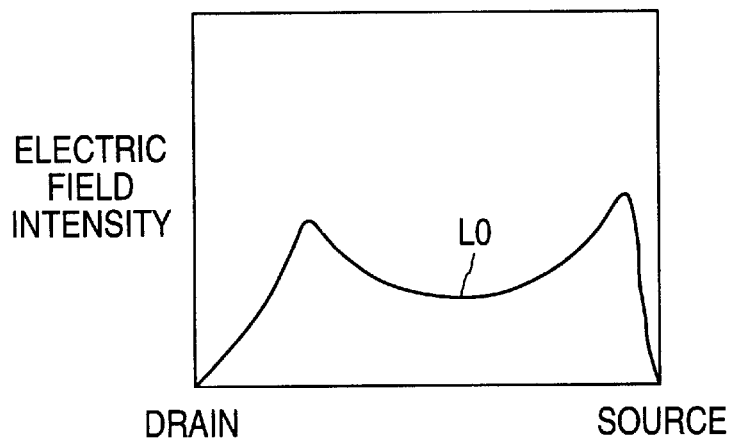
FIG. 3 is a graph illustrating the intensity of the electric field along the surface of the channel region between the drain and source regions of cell 200.
Figure 5:
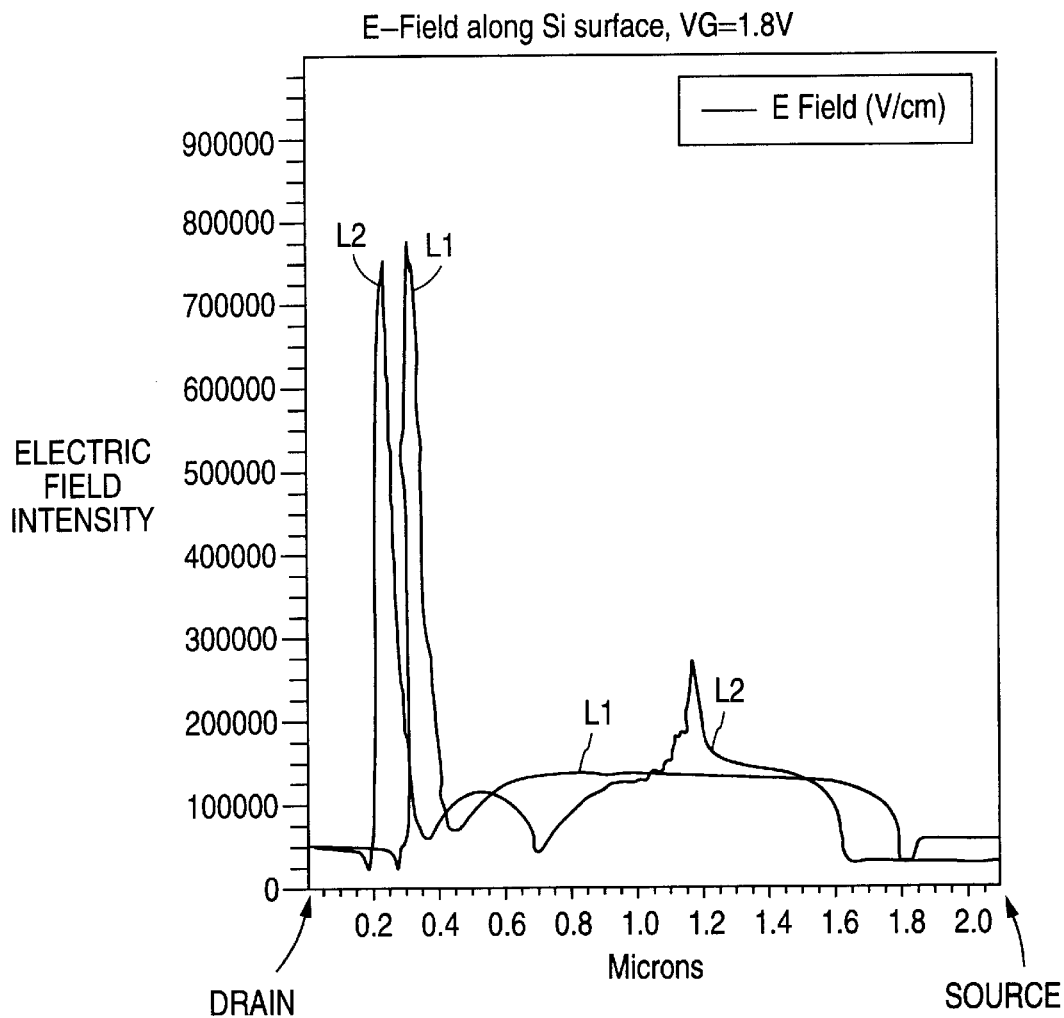
FIG. 5 is a graph illustrating the intensity of an electric field along the surface of the channel region between the drain and source regions of cells 100 and 400 in accordance with the present invention.

FIG. 5 shows a graph that illustrates the drain-to-source electric field intensity along the surface of the channel region between the drain and source regions of cells 100 and 400 during programming. As shown in FIG. 5, line L1 illustrates the electric field intensity in cell 100 of FIG. 1, while line L2 illustrates the electric field intensity in cell 400 (where cells 100 and 400 have approximately the same gate length and gate oxide thickness).

As shown in FIG. 5, cells 100 and 400 both have peaks near the drain region. Near the source region, however, cell 100 has a relatively flat field intensity whereas cell 400 has a second peak which is approximately 1.5 to 2.0 times greater than the field intensity of cell 100.

As a result, cell 400 has a greater injection efficiency than does cell 100. One of the advantages of having a greater injection efficiency is that cell 400 can be programmed in less time than is required to program cell 100.

Figure 6:
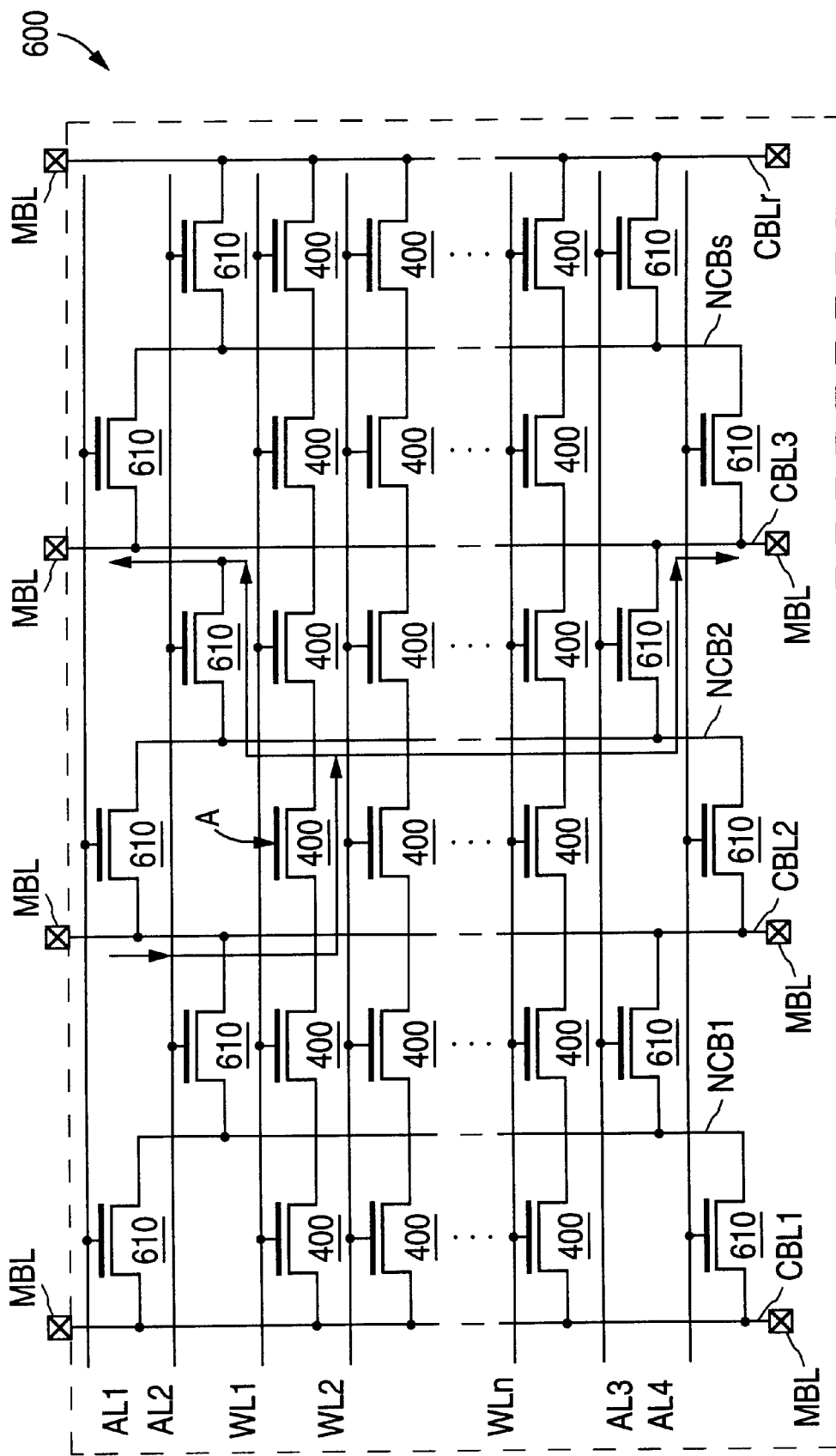
FIG. 6 is a schematic diagram illustrating a segment 600 of a plurality of segments that form a memory array in accordance with the present invention.

FIG. 6 shows a schematic diagram that illustrates a segment 600 of a plurality of segments that form a memory array in accordance with the present invention. (Rather than representing a segment, FIG. 6 may also be viewed as representing the entire memory array).

As shown in FIG. 6, segment 600 includes a plurality of cells 400 (of FIG. 4) which are arranged in rows and columns. Segment 600 also includes a plurality of contacted bit lines CBL1–CBLr which are connected to the drains of cells 400 such that each contacted bit line CBL is connected to all of the drains in two adjacent columns of cells. Each contacted bit line CBL, in turn, is connected to a metal bit line contact MBL.

Segment 600 further includes a plurality of non-contacted bit lines NCB1–NCBs which are formed so that one non-contacted bit line NCB is positioned between each pair of adjacent contacted bit lines CBL, and connected to the sources of cells 400 such that each non-contacted bit line NCB is connected to all of the sources in two adjacent columns of cells.

Segment 600 additionally includes a plurality of access transistors 610 which are formed in four rows so that an access transistor 610 is formed at each end of each column of memory cells 112. In addition, each row of access transistors 610 is formed so that an access transistor 610 is connected to every other pair of adjacent contacted and noncontacted bit lines CBL1–CBLr and NCB1–NCBs.

As further shown in FIG. 6, segment 600 includes a plurality of word lines WL1–WLn which are connected to cells 400 so that a word line WL is connected to each cell 400 in a row of cells 400. Similarly, segment 600 also includes four access lines AL1–AL4 which are connected to access transistors 610 so that an access line AL is connected to each access transistor 610 in a row of access transistors 610.

To program a selected cell in segment 600, an access voltage is applied to the access lines AL that are connected to the access transistors 610 that are connected to the source region of the selected cell, while ground is applied to the remaining access lines AL. For example, if cell A is to be programmed, then an access voltage is applied to access line AL2 and access line AL3 while ground is applied to access lines AL1 and AL4.

Applying an access voltage to access lines AL2 and AL3 turns on the access transistors in the two columns adjacent to the column that includes cell A which, in turn, electrically connects cell A to contacted bit line CBL3.

In addition, a drain voltage is applied to the contacted bit line CBL that is connected to the cell to be programmed, while ground is applied to the remaining contacted bit lines CBL. Thus, to program cell A, the drain voltage is applied to contacted bit line CBL2 which places the drain voltage on the drain of cell A. Since cell A is electrically connected to contacted bit line CBL3 via the access transistors, ground is connected to the source of cell A via the access transistors and non-contacted bit line NCB2.

Further, a programming voltage is applied to the word line WL that corresponds to the cell to be programmed, and ground to the remaining word lines WL. Thus, to program cell A, the programming voltage is applied to word line WL1 while ground is applied to the remaining word lines WL2–WLn.

These bias conditions result in a current flow as shown by the arrow in FIG. 6 which results in electrons being injected onto the floating gate of cell A near both the source and drain of cell A, thus programming cell A.

FIGS. 7A–11A show a series of plan views that illustrate a process for forming segment 600 in accordance with the present invention. FIGS. 7B–11B show a series of cross-sectional views taken along lines 7B—7B, 8B—8B, 9B—9B, 10B—10B, and 11B—11B of FIGS. 7A, 8A, 9A, 10A, and 11A, respectively. FIGS. 7C–11C show a series of cross-sectional views taken along lines 7C—7C, 8C—8C, 9C—9C, 10C—10C, and 11C–11C of FIGS. 7A, 8A, 9A, 10A, and 11A, respectively.

Figure 7A:
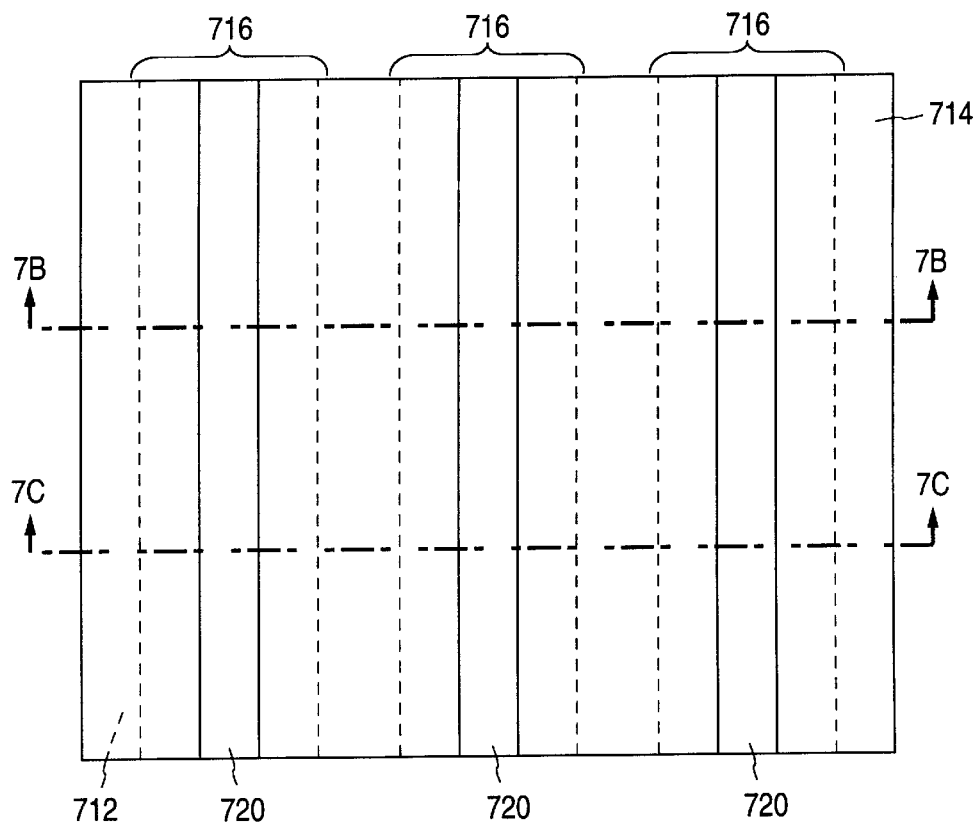
Figure 7B:
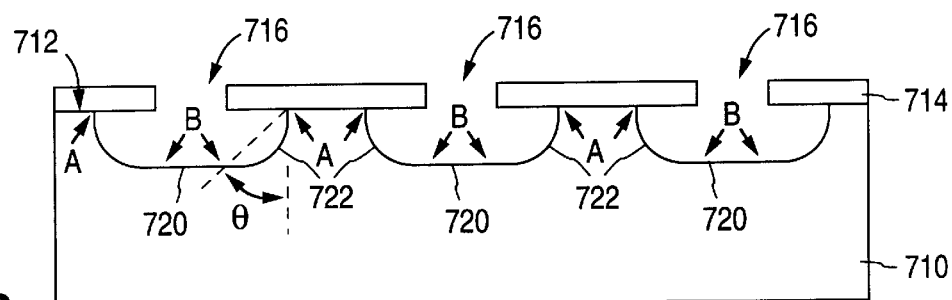
Figure 7C:
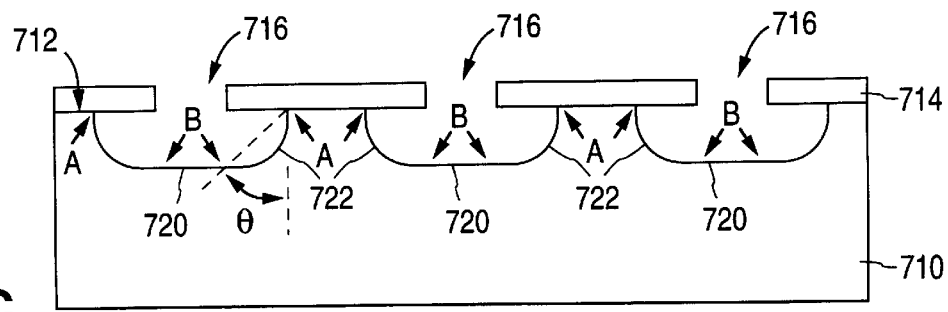

As shown in FIGS. 7A–7C, the process of the present invention begins with a conventionally formed semiconductor material 710, such as a substrate or well, which has a top surface 712. Following this, a trench mask 714 is formed and patterned on substrate 710.

Next, the exposed regions of substrate 710 are isotropically etched to form a series of trenches 716. (Alternately, substrate 710 may be anisotropically etched, and then isotropically etched to vary the shape of the trench). Substrate 710 is implanted to set the threshold voltages of the transistors after the trench formation.

As shown in FIGS. 7A–7C, each trench 716 has a bottom surface 720 and a pair of sidewall surfaces 722 which connect bottom surface 720 to the pair of adjoining top surfaces 712. Top surface 712 of substrate 710 represents a first surface (412) while bottom surface 720 of trench 716 represents a second surface (414).

Further, each sidewall surface 722 (416) is connected to top surface 712 at a point A, and to bottom surface 720 at a point B. A line drawn through points A and B, and a line normal to top surface 712 through point A define an angle φ which ranges from greater than zero to less than 90 degrees. After the series of trenches 716 have been formed, trench mask 714 is removed.

Figure 8A:
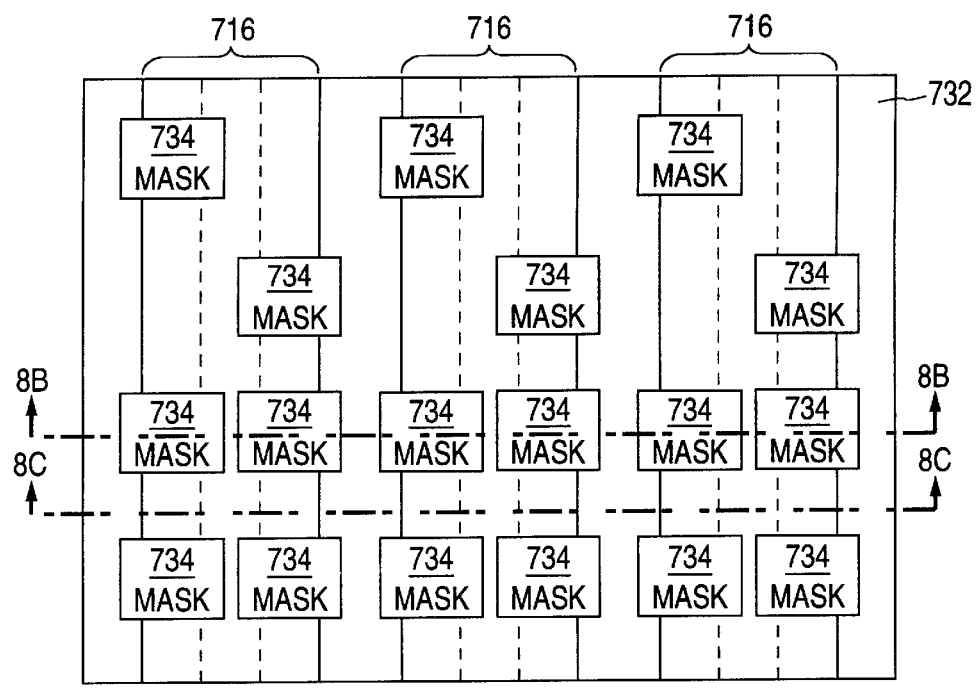
Figure 8B:
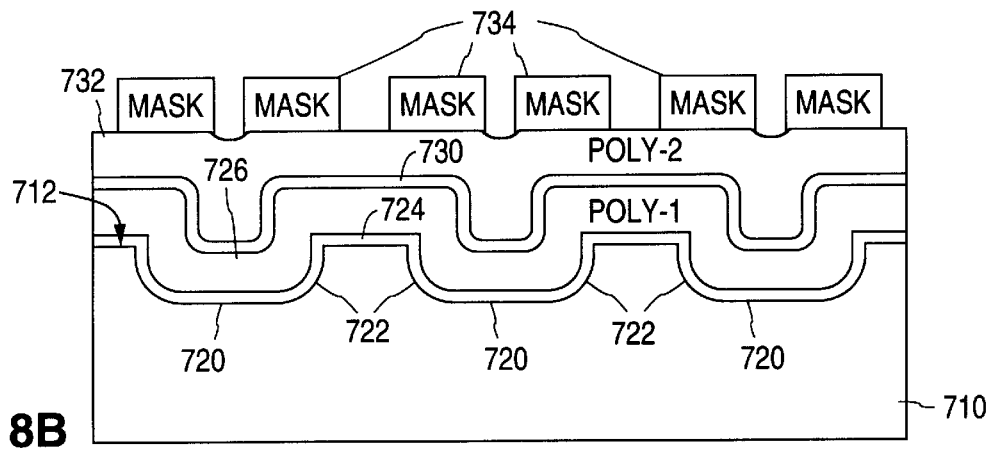
Figure 8C:
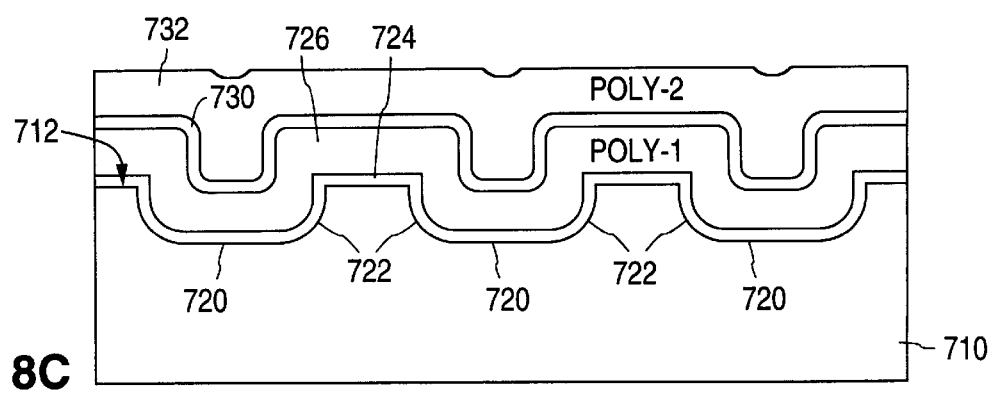

As shown in FIGS. 8A–8C, once mask 714 has been removed, a layer of gate oxide 724 is formed over top surface 712, bottom surface 720, and sidewall surfaces 722 of substrate 710. Next, a layer of first polysilicon (poly-1) 726 is deposited on gate oxide layer 724, and then doped.

Once poly-1 layer 726 has been doped, a layer of inter-poly dielectric 730, such as ONO (oxide-nitride-oxide), is formed on poly-1 layer 726. Following this, a second layer of polysilicon (poly-2) 732 is deposited on dielectric layer 730, and then doped. Once poly-2 layer 732 has been doped, a stacked gate mask 734 is formed and patterned on poly-2 layer 732.

Figure 9A:
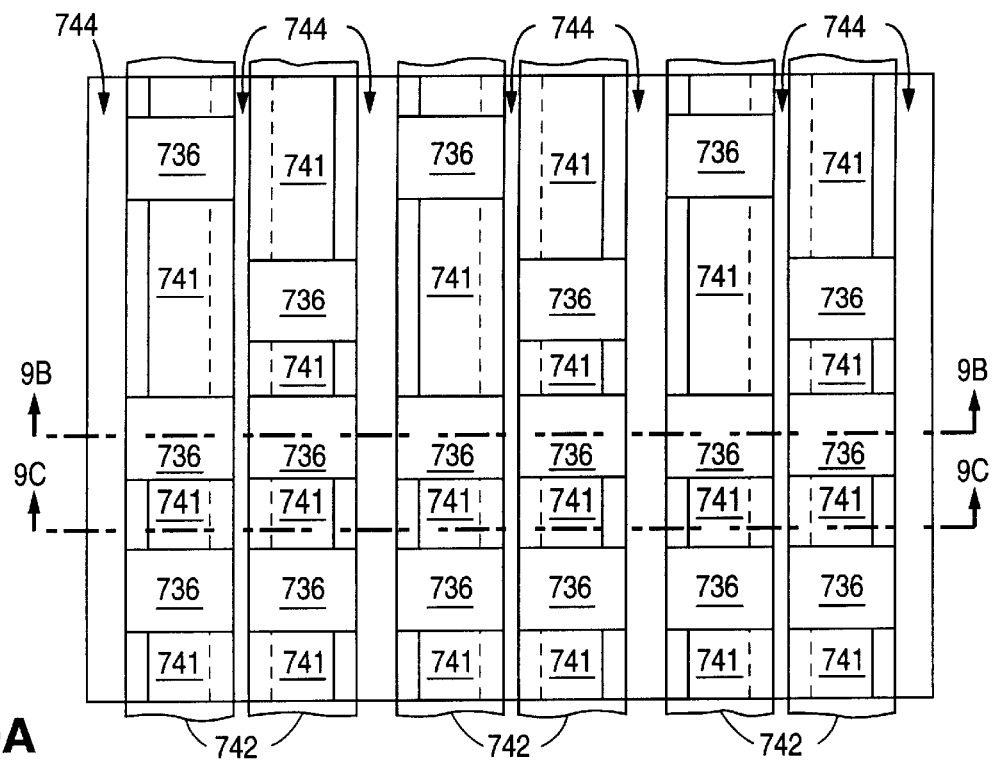
Figure 9B:
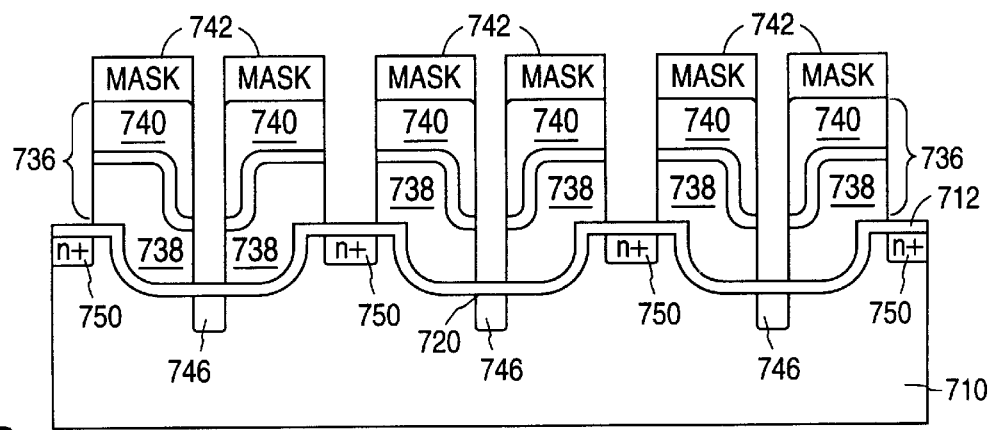
Figure 9C:
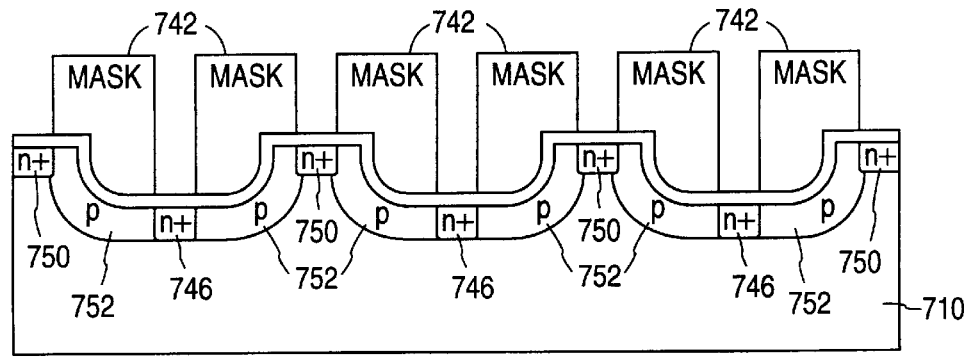

As shown in FIGS. 9A–9C, the exposed regions of poly-2 layer 732, and the underlying layers of interpoly dielectric and poly-1 730 and 726, are anisotropically etched to form a plurality of stacked gates structures 736 which each have a floating gate 738 and a control gate 740, and an exposed gate oxide region. (This etching step may cause some trenching of the substrate surface due to the severe topology).

As further shown in FIGS. 9A–9C, access transistors 610 will be formed from the stacked gate structures 736 in the first two rows, while memory transistors 400 will be formed from the stacked gate structures 736 in the third and fourth rows.

Following this, mask 734 is removed. A light dose of p-type material, such as boron, is then implanted using a large angle tilt or plasma immersion techniques to form channel stop regions 741 between each stacked gate structure 736 in each column of stack gate structures 736. After this, the wafer is annealed in an oxidizing ambient to repair etch damage and drive in the channel stop implant.

Next, an implant mask 742 is then formed and patterned over the stacked gate structures 736 and portions of the exposed gate oxide region to define a plurality of implant strips 744 on top and bottom surfaces 712 and 720. Next, a n-type material, such as arsenic or phosphorous, is implanted into the implant strips 744 to form n+ source and drain lines 746 and 750. After this, mask 742 is removed.

Figure 10A:
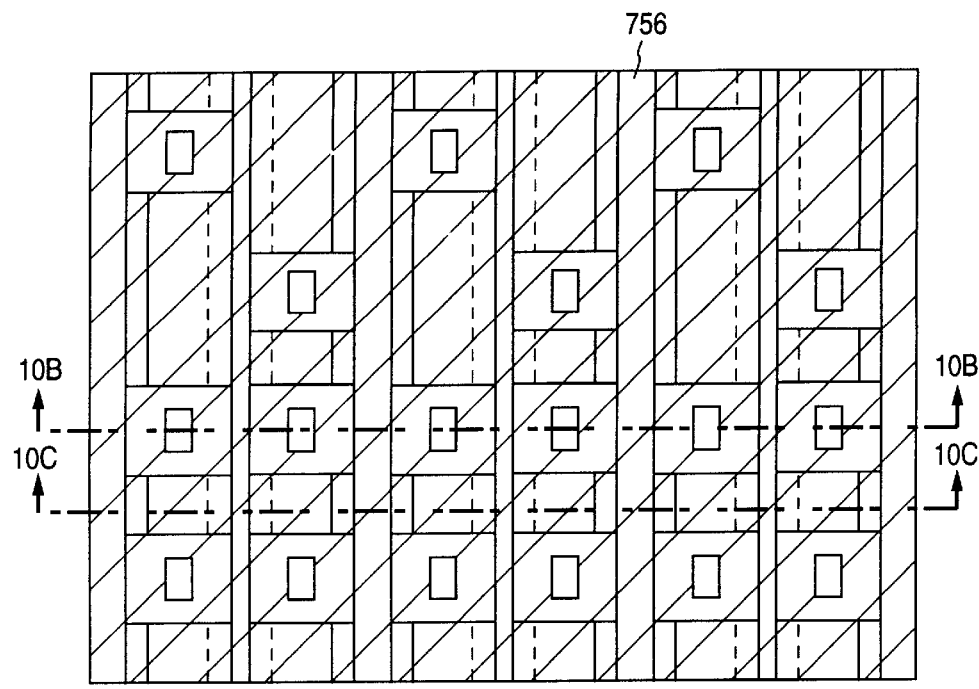
Figure 10B:
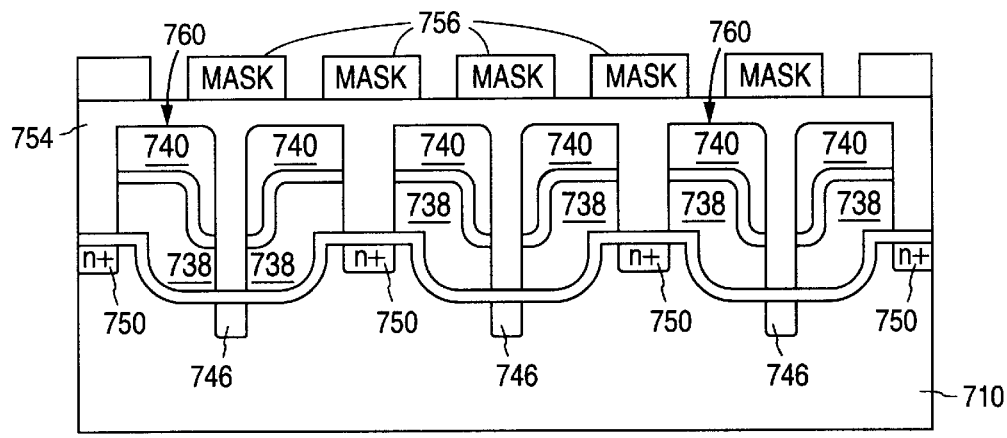
Figure 10C:
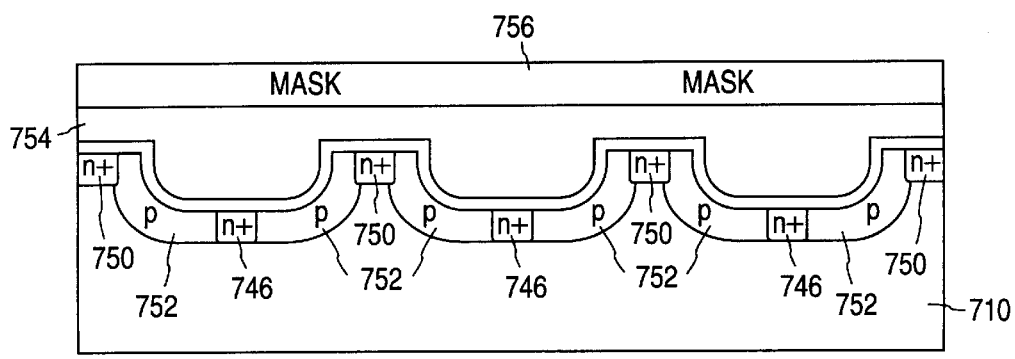

As shown in FIGS. 10A–10C, once the source and drain lines 746 and 750 have been formed, a layer of oxide dielectric 754 is deposited over stacked gate structures 736, source and drain regions 746 and 750, and isolation regions 752, and then planarized. Dielectric layer 754 serves both as the poly-to-metal isolation and the field oxide isolation.

Next, a contact opening mask 756 is formed and patterned on dielectric layer 754 to define a contact region 760 on the surface of each control gate 740. Next, the exposed regions of dielectric layer 754 are anisotropically etched until dielectric layer 754 has been removed from contact region 760 on the surface of each control gate 740. Mask 756 is then removed. Once mask 756 has been stripped, a layer of contact material (not shown) is deposited on dielectric layer 754 and the contact regions 760.

Figure 11A:
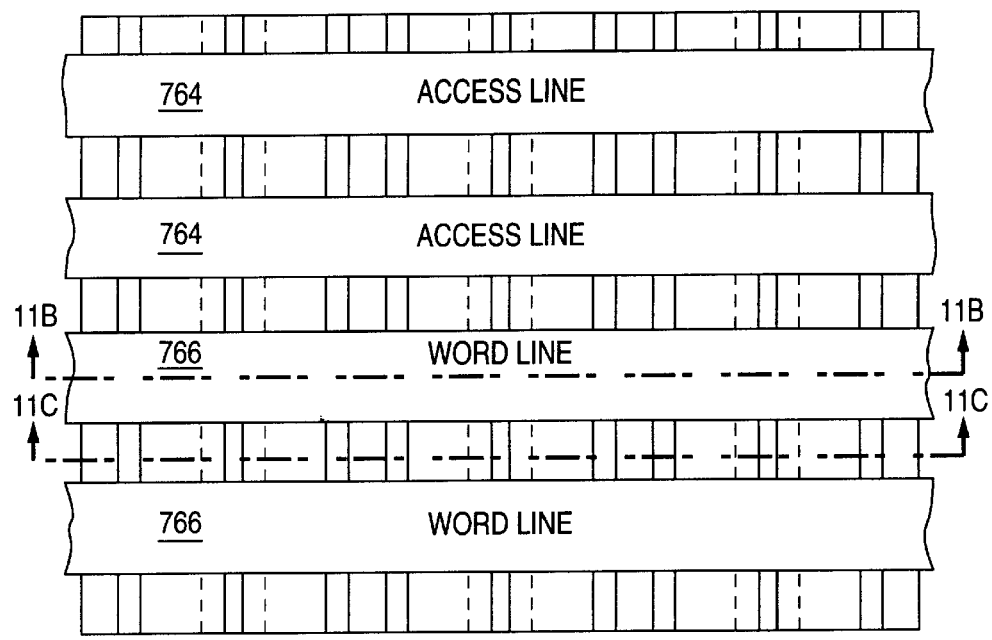
Figure 11B:
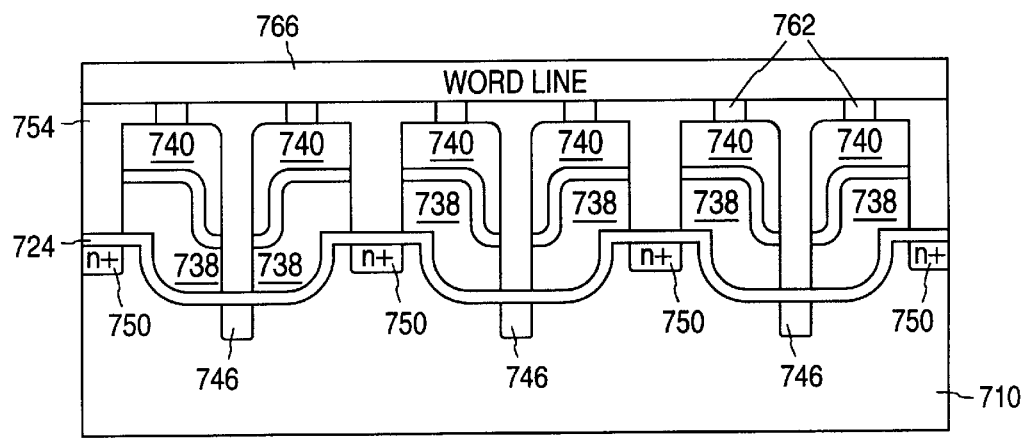
Figure 11C:
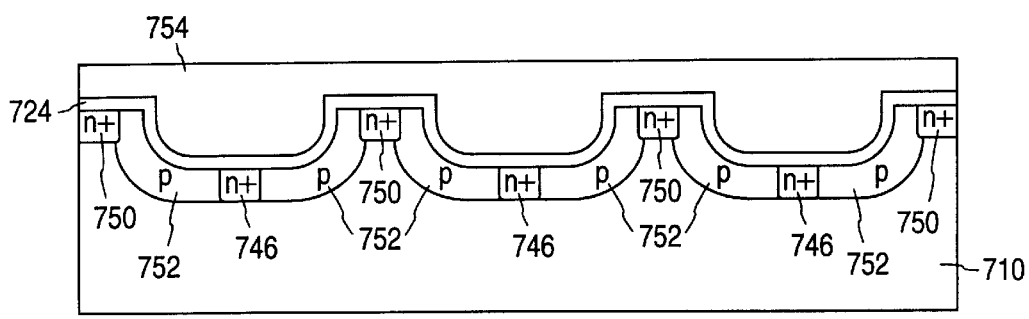

As shown in FIGS. 11A–11C, the contact material is then etched until the contact material has been removed from the top surface of dielectric layer 754, thereby forming contacts 762. Once contacts 762 have been formed, a layer of metal (not shown) is deposited over dielectric layer 754 and contacts 762. Following this, an access/word line mask (not shown) is formed and patterned over the layer of metal.

Next, the exposed regions of the layer of metal are anisotropically etched until the layer of metal has been removed from dielectric layer 754, thereby forming access lines 764 (AL1–AL4) and word lines 766 (WL1–WLn). The access/word line mask is then removed, and the process continues with conventional steps.

As described in the above process flow, access transistors 610 are formed to be stacked-gate transistors. Access transistors 610 may alternately be formed to be single-poly transistors during the same process steps that are used to form the n-channel and p-channel peripheral transistors. When access transistors 610 are formed to be stacked gate transistors, the access transistors are formed to be larger than memory transistors 400 to increase the charge flow through the access transistors 610.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A method for forming a memory device in a semiconductor material of a first conductivity type, the semiconductor material having a top surface, the method comprising the steps of:

forming a plurality of trenches in the semiconductor material that extend continuously across the semiconductor material, the plurality of trenches defining a plurality of top surface strips that extend continuously across the top surface of the semiconductor material between adjacent pairs of trenches, the plurality of trenches having a plurality of bottom surfaces and sidewall surfaces such that each trench has a bottom surface that extends continuously across the semiconductor material and a pair of sidewall surfaces which connect the bottom surface to adjacent pairs of top surface strips;

forming a layer of gate oxide over the top surface strips, the bottom surfaces, and the sidewall surfaces;

forming a layer of first polysilicon (poly-1) on the gate oxide layer;

forming a layer of interpoly dielectric on the poly-1 layer;

forming a second layer of polysilicon (poly-2) on the interpoly dielectric layer;

etching the poly-2 layer, the layer of interpoly dielectric, and the layer of poly-1 to form a plurality of stacked gate structures on each sidewall surface of each trench, each stacked gate structure having a floating gate and a control gate; and implanting the semiconductor material so that a plurality of drain and source lines that extend continuously across the semiconductor material are formed in the top and the bottom surfaces.

2. The method of claim 1 and further comprising the step of implanting the semiconductor material to form isolation regions between each adjacent pair of stacked gate structures on each sidewall surface of each trench.

3. The method of claim 1 wherein the implanting step is performed after the poly-2 layer has been etched.

4. The method of claim 3 and further comprising the step of forming a layer of dielectric over the stacked gate structures, the source and drain regions, and the isolation regions; and planarizing the layer of dielectric.

5. The method of claim 3 wherein each stacked gate structure wherein each stacked gate structure is formed on only one sidewall surface.

6. The method of claim 4 and further comprising the steps of:

selectively etching the layer of dielectric to form a plurality of contact openings, each contact opening exposing the control gate of a stacked gate structure;

forming a layer of contact material on the layer of dielectric to fill up the contact openings; and selectively etching the contact material to form contacts.

7. The method of claim 1 wherein the forming a plurality of trenches step includes the steps of:

forming a trench mask on the semiconductor material; and isotropically etching the semiconductor material to form the plurality of trenches.

8. The method of claim 1 wherein the forming a plurality of trenches step includes the steps of:

forming a trench mask on the semiconductor material;

anisotropically etching a portion of the semiconductor material; and isotropically etching the semiconductor material after the anisotropic etch to form the plurality of trenches.

9. The method of claim 1 wherein each sidewall surface is connected to a top surface strip at point A, and to a bottom surface at point B, a line drawn through points A and B, and a line normal to the top surface strip through point A defining an acute angle which ranges from greater than zero to less than 90 degrees.

10. The method of claim 1 wherein a top surface strip and a bottom surface are substantially parallel to each other.

11. The method of claim 6 and further comprising the steps of:

forming a layer of metal over the layer of dielectric and the contacts; and selectively etching the layer of metal to form word lines such that each word line is connected to all of the contacts in a row of contacts, the word lines being perpendicular to the source lines.

12. The method of claim 3 and further comprising the steps of:

forming a plurality of contacts that are connected to the control gates such that each contact is connected to a corresponding control gate; and forming a plurality of word lines that are connected to the contacts such that each word line is connected to all of the contacts in a row of contacts, the word lines being perpendicular to the source lines.

* * * * *